(12) United States Patent
Nomura

(10) Patent No.: US 11,968,815 B2
(45) Date of Patent: Apr. 23, 2024

(54) MODULE

(71) Applicant: Murata Manufacturing Co., Ltd., Kyoto-fu (JP)

(72) Inventor: Tadashi Nomura, Nagaokakyo (JP)

(73) Assignee: MURATA MANUFACTURING CO., LTD., Kyoto-Fu (JP)

(*) Notice: Subject to any disclaimer, the term of this patent is extended or adjusted under 35 U.S.C. 154(b) by 348 days.

(21) Appl. No.: 17/457,285

(22) Filed: Dec. 2, 2021

(65) Prior Publication Data

US 2022/0095496 A1 Mar. 24, 2022

Related U.S. Application Data

(63) Continuation of application No. PCT/JP2020/022290, filed on Jun. 5, 2020.

(30) Foreign Application Priority Data

Jun. 13, 2019 (JP) .................................. 2019-110475

(51) Int. Cl.
*H05K 9/00* (2006.01)
*H05K 1/18* (2006.01)

(52) U.S. Cl.
CPC ........... *H05K 9/0026* (2013.01); *H05K 1/181* (2013.01); *H05K 2201/10075* (2013.01); *H05K 2201/10371* (2013.01); *H05K 2201/1056* (2013.01)

(58) Field of Classification Search
CPC .... H05K 1/14; H05K 1/141–147; H05K 1/18; H05K 1/181–188; H05K 9/00;
(Continued)

(56) References Cited

U.S. PATENT DOCUMENTS

| 8,779,563 B2 * | 7/2014 | Brunnbauer | H01L 23/48 |
| | | | 257/659 |
| 10,964,645 B2 * | 3/2021 | Yazaki | H05K 1/0237 |

(Continued)

FOREIGN PATENT DOCUMENTS

| JP | 2001-156484 A | 6/2001 |
| JP | 2007-324469 A | 12/2007 |

(Continued)

OTHER PUBLICATIONS

International Search Report for PCT/JP2020/022290 dated Aug. 25, 2020.
Written Opinion for PCT/JP2020/022290 dated Aug. 25, 2020.

*Primary Examiner* — Tuan T Dinh
(74) *Attorney, Agent, or Firm* — Pearne & Gordon LLP

(57) ABSTRACT

A module comprises: a wiring board; a first component, a second component and a third component mounted on a first main surface; a shield structure mounted on the first main surface; a first sealing resin that seals the first component and the like; and a shield film that covers an upper surface of the first sealing resin and the like, the shield structure including a top side portion and at least one sidewall portion bent from the top side portion and thus extending therefrom, the top side portion including the top side portion's conductive layer and a magnetic layer therein, the sidewall portion including the sidewall portion's conductive layer therein, the top side portion's conductive layer and the sidewall portion's conductive layer being electrically connected to a ground conductor, the magnetic layer in the top side portion being located over the first component.

16 Claims, 10 Drawing Sheets

(58) Field of Classification Search
CPC ........ H05K 1/02; H05K 1/028; H05K 1/0216;
H05K 2201/10371; H05K 2201/1056;
H01L 23/00; H01L 23/29; H01L 23/31;
H01L 23/552
USPC ....... 361/760, 764, 782–784, 795, 816, 818;
174/520; 257/660–690, 710
See application file for complete search history.

(56) References Cited

U.S. PATENT DOCUMENTS

| | | | |
|---|---|---|---|
| 2011/0229708 A1* | 9/2011 | Asami | H01L 24/97 |
| | | | 428/316.6 |
| 2012/0320559 A1* | 12/2012 | Kimura | H01L 23/552 |
| | | | 361/818 |
| 2013/0271928 A1* | 10/2013 | Shimamura | H05K 9/0084 |
| | | | 29/841 |
| 2017/0294387 A1 | 10/2017 | Kawabata et al. | |
| 2017/0354039 A1 | 12/2017 | Miwa | |
| 2018/0033738 A1* | 2/2018 | Kawabata | H01L 23/49838 |
| 2018/0077829 A1* | 3/2018 | Yamamoto | B32B 15/08 |
| 2018/0166394 A1 | 6/2018 | Otsubo et al. | |
| 2020/0137893 A1 | 4/2020 | Nomura et al. | |

FOREIGN PATENT DOCUMENTS

| | | |
|---|---|---|
| JP | 2011-147011 A | 7/2011 |
| JP | 2017-191822 A | 10/2017 |
| WO | 2016/092893 A1 | 6/2016 |
| WO | 2017/026430 A1 | 2/2017 |
| WO | 2019/004332 A1 | 1/2019 |

\* cited by examiner

MODULE

CROSS REFERENCE TO RELATED APPLICATION

This is a continuation of International Application No. PCT/JP2020/022290 filed on Jun. 5, 2020 which claims priority from Japanese Patent Application No. 2019-110475 filed on Jun. 13, 2019. The contents of these applications are incorporated herein by reference in their entireties.

TECHNICAL FIELD

The present invention relates to a module.

BACKGROUND ART

An example of a high frequency module is described in WO 2019/004332 A1 (PTL 1). PTL 1 discloses a configuration in which a Cu block referred to as a "shield component" is mounted on a mounted electrode provided on an upper surface of a wiring board. The shield component is also referred to as a "conductive member." The wiring board is provided with a sealing resin provided with a recess to expose a portion of an upper surface of the shield component. A shield film covering an upper surface of a sealing resin layer and the like also covers an inner surface of the recess, and covers an upper surface of the shield component. PTL 1 also discloses a configuration in which a magnetic sheet is disposed on an upper surface of the sealing resin layer so as to overlap an upper or lower side of the shield film.

CITATION LIST

Patent Literature

PTL. 1: International Publication No. 2019/004332 A1

SUMMARY OF THE INVENTION

Technical Problem

The structure described in PTL 1 requires successively performing all of steps of a complicated process, that is, the steps of mounting a shield component, forming a sealing resin layer, forming a recess, forming a magnetic film, and forming a shield film. When any one of these steps is defective, the individual piece of the module of interest will be a defective product, resulting in an increased defect rate as a whole.

When the module is a communication module, the steps of the complicated process will be successively performed for an expensive IC. An increased defect rate implies that a defective product having an expensive IC incorporated therein must be discarded, and loss in cost increases.

In view of the above, the present invention contemplates a module capable of suppressing a defect rate and suppressing a loss in cost attributed to a defective product.

Solution to Problem

In order to achieve the above object, a module in a first aspect of the present invention comprises: a wiring board having a first main surface and including a ground conductor; a first component and a second component mounted on the first main surface; a shield structure mounted on the first main surface; a first sealing resin that seals the first component, the second component and the shield structure; and a shield film that covers an upper surface and side surface of the first sealing resin and a side surface of the wiring board, the shield film being electrically connected to the ground conductor, the shield structure having a conductive layer and a magnetic layer, the shield structure further including a top side portion and at least one sidewall portion bent from the top side portion and thus extending therefrom, the magnetic layer at the top side portion being located over the first component, the conductive layer at the sidewall portion being electrically connected to the ground conductor between the first component and the second component.

In order to achieve the above object, a module in a second aspect of the present invention comprises: a wiring board having a first main surface and including a ground conductor; a first component, a second component, and a third component mounted on the first main surface; a shield structure mounted on the first main surface; a first sealing resin that seals the first component, the second component, the third component, and the shield structure; and a shield film that covers an upper surface and side surface of the first sealing resin and a side surface of the wiring board, the shield film being electrically connected to the ground conductor, the shield structure including a top side portion and at least one sidewall portion bent from the top side portion and thus extending therefrom, the top side portion including the top side portion's conductive layer and a magnetic layer therein, the sidewall portion including the sidewall portion's conductive layer therein, the top side portion's conductive layer and the sidewall portion's conductive layer being electrically connected to the ground conductor, the magnetic layer at the top side portion being located over the first component, the sidewall portion's conductive layer being disposed between the second component and the third component.

Advantageous Effects of Invention

According to the present invention, only a shield structure prepared in advance as a separate component that is inspected and found to be a non-defective product can be selected and used for assembling the module, and the module can suppress a defect rate and hence a loss in cost attributed to a defective product.

DESCRIPTION OF EMBODIMENTS

The figures indicate a dimensional ratio, which does not necessarily provide a representation which is faithful to reality, and may be exaggerated for convenience of illustration. In the following description, when referring to a concept of being upper or lower, it does not necessarily mean being absolutely upper or lower and may instead mean being relatively upper or lower in a position shown in a figure.

First Embodiment

Figure 1:
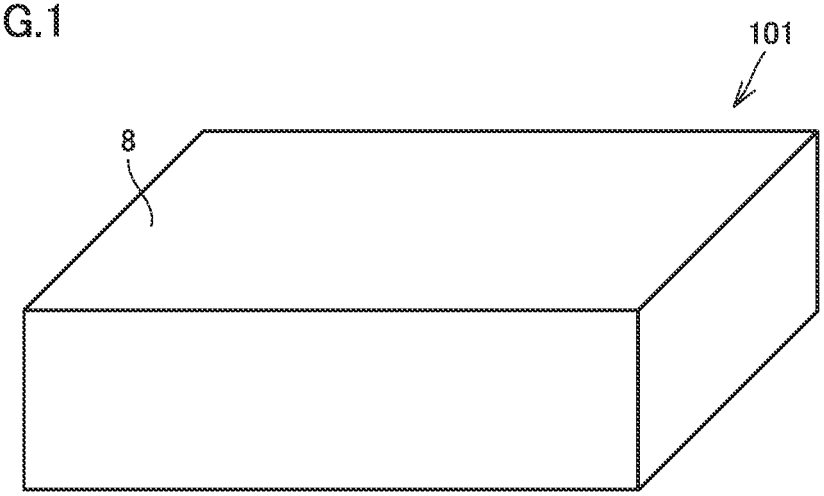
FIG. 1 is a perspective view of a module according to a first embodiment of the present invention.

A module according to a first embodiment of the present invention will now be described with reference to FIGS. 1 to 7. FIG. 1 shows an external appearance of a module 101 according to the present embodiment. Module 101 has, for example, a rectangular parallelepiped shape, and module 101 has an upper surface and a side surface covered with a shield film 8. Module 101 has a lower surface uncovered with shield film 8, and a plurality of external terminals 15 (see FIG. 3 or 4) are disposed on the lower surface.

Figure 2:
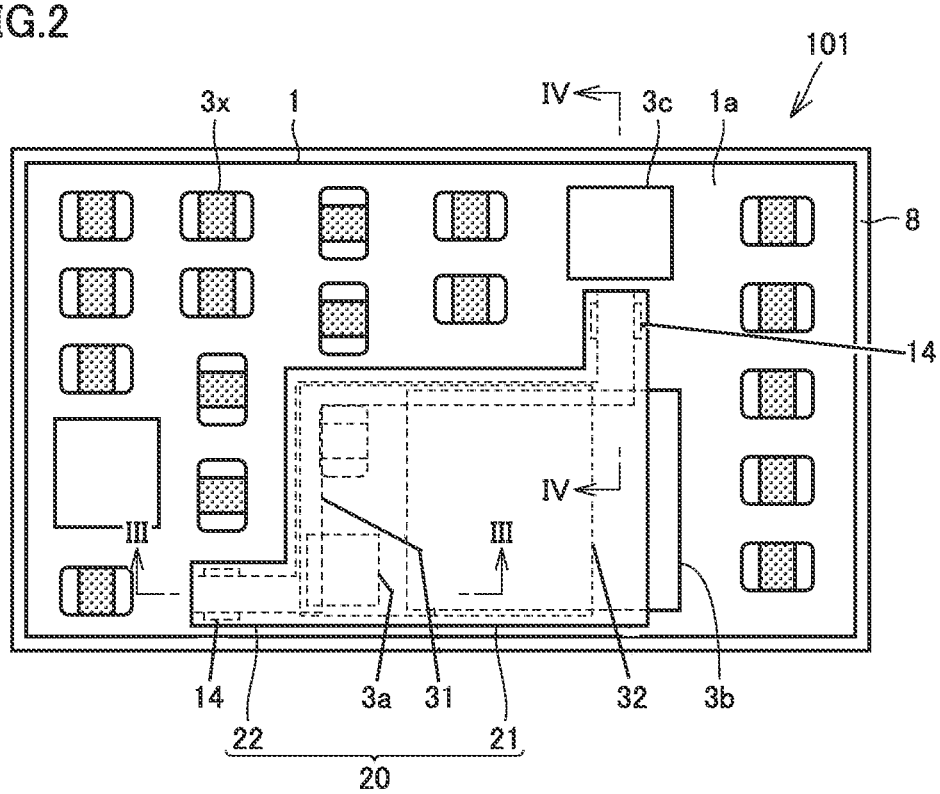
FIG. 2 is a transparent plan view of the module according to the first embodiment of the present invention.
Figure 3:
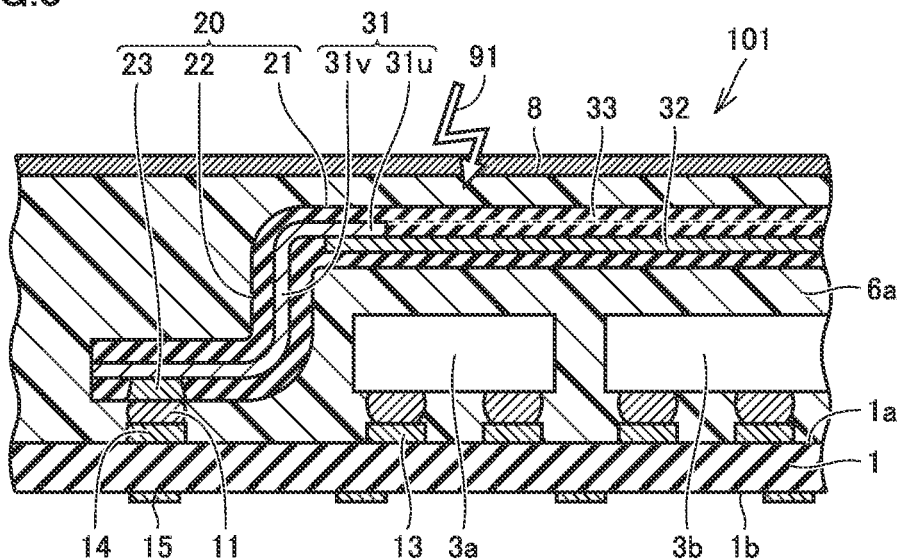
FIG. 3 is a cross-sectional view taken along a line III-III indicated in FIG. 2.
Figure 4:
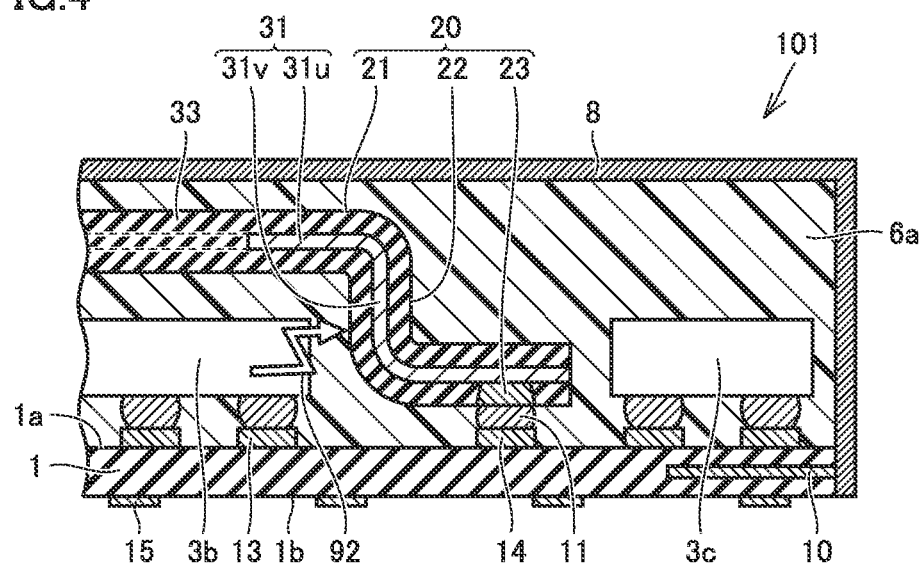
FIG. 4 is a cross-sectional view taken along a line IV-IV indicated in FIG. 2.

FIG. 2 is a transparent view of module 101 showing an interior thereof as viewed exactly from above. FIG. 3 is a cross-sectional view taken along a line III-III indicated in FIG. 2. FIG. 4 is a cross-sectional view taken along a line IV-IV indicated in FIG. 2.

Module 101 comprises a wiring board 1. Wiring board 1 has a first main surface 1a and includes a ground conductor 10. Ground conductor 10 is disposed on a surface of or inside wiring board 1. In the example indicated herein, as shown in FIG. 4, ground conductor 10 is disposed inside wiring board 1. As shown in FIGS. 3 and 4, electrodes 13 and 14 are disposed on first main surface 1a. Electrode 13 is for mounting each component and is electrically connected to an external terminal of each component. Electrode 14 is electrically connected to ground conductor 10 via a wiring (not shown). Module 101 comprises a first component 3a, a second component 3b, and a third component 3c mounted on first main surface 1a. Module 101 may also comprise another component 3x. In the example indicated herein, a plurality of components 3x are mounted on first main surface 1a.

Figure 5:
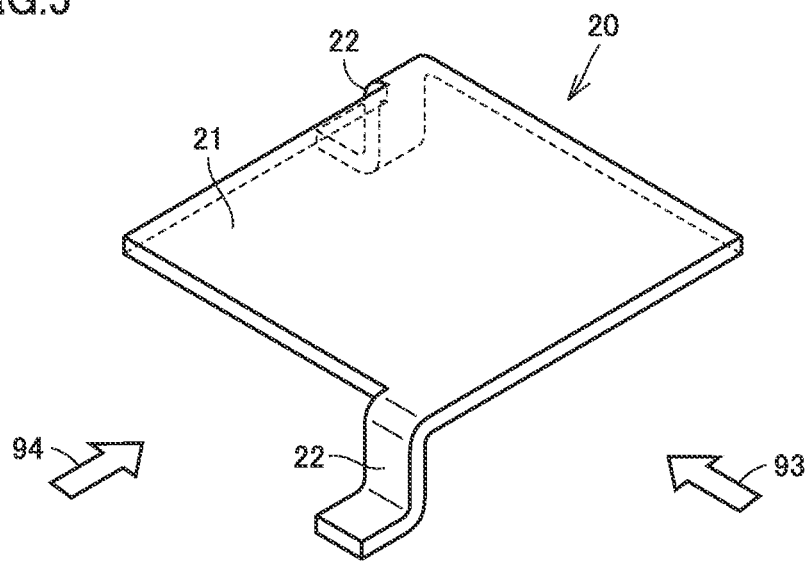
FIG. 5 is a perspective view of a conductor incorporated structure comprised in the module according to the first embodiment of the present invention.
Figure 6:
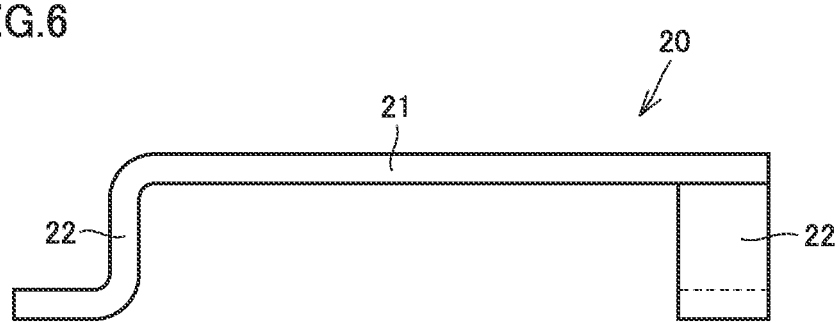
FIG. 6 is a first side view of the conductor incorporated structure comprised in the module according to the first embodiment of the present invention.
Figure 7:
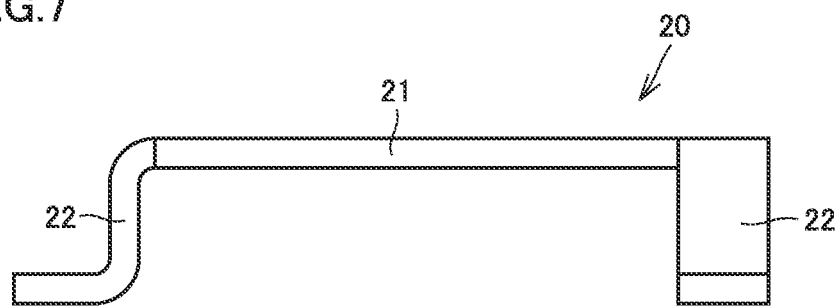
FIG. 7 is a second side view of the conductor incorporated structure comprised in the module according to the first embodiment of the present invention.

Module 101 comprises a shield structure 20, a first sealing resin 6a, and a shield film 8. FIG. 5 is a perspective view of shield structure 20 extracted alone. FIG. 6 is a side view of shield structure 20 viewed in a direction indicated by an arrow 93 indicated in FIG. 5. FIG. 7 is a side view of shield structure 20 viewed in a direction indicated by an arrow 94 indicated in FIG. 5.

Shield structure 20 is mounted on first main surface 1a of wiring board 1. First sealing resin 6a seals first component 3a, second component 3b, third component 3c, and shield structure 20. As shown in FIG. 4, shield film 8 covers an upper surface and side surface of first sealing resin 6a and a side surface of wiring board 1. As shown in FIG. 4, shield film 8 is electrically connected to ground conductor 10. Shield structure 20 includes a top side portion 21 and at least one sidewall portion 22 bent from top side portion 21 and thus extending therefrom. In the example indicated herein, shield structure 20 includes two sidewall portions 22. Shield structure 20 includes a conductive layer 31. Conductive layer 31 includes the top side portion's conductive layer 31u and the sidewall portion's conductive layer 31v. Top side portion 21 includes the top side portion's conductive layer 31u and a magnetic layer 32 therein. Sidewall portion 22 includes the sidewall portion's conductive layer 31v therein. The top side portion's conductive layer 31u and the sidewall portion's conductive layer 31v are electrically connected to ground conductor 10 via electrode 14. Magnetic layer 32 in top side portion 21 is located over first component 3a. As shown in FIG. 4, the sidewall portion's conductive layer 31v is disposed between second component 3b and third component 3c.

The shield structure preferably has a structure in which the conductive layer and the magnetic layer are embedded in an insulator. By adopting this configuration, the conductive layer and the magnetic layer can be insulated from other members.

An external low-frequency interference wave 91 is, for example, an electromagnetic wave of not less than about 100 kHz and not more than about 10 MHz. As shown in FIG. 3, low-frequency interference wave 91 arrives from outside module 101.

As shown in FIG. 4, an internal interference wave 92 is generated from second component 3b and travels toward third component 3c.

Shield structure 20 includes a connection electrode 23. Connection electrode 23 is electrically connected to conductive layer 31. In the example shown in FIGS. 3 and 4, shield structure 20 has sidewall portion 22 with a lower end bent and extending horizontally so that electrical connection is made to first main surface 1a by a lower surface of shield structure 20. Electrode 14 disposed on first main surface 1a and connection electrode 23 provided on the lower surface of shield structure 20 are electrically connected by solder 11.

In the present embodiment, shield structure 20 including top side portion 21 over first component 3a is provided, and external low-frequency interference wave 91 arriving from above can be shielded by magnetic layer 32 internal to top side portion 21. This can prevent low-frequency interference wave 91 from affecting first component 3a.

Furthermore, inside module 101, internal interference between components can be a problem, whereas in the present embodiment, shield structure 20 is disposed such that the sidewall portion's conductive layer 31v is located between second component 3b and third component 3c, and internal interference wave 92 traveling from second component 3b toward third component 3c is shielded by the sidewall portion's conductive layer 31v. This can prevent internal interference wave 92 from affecting third component 3c.

In the present embodiment, shield structure 20 can be formed in advance as a component separate from wiring board 1. Shield structure 20 formed as a separate component can be alone inspected in advance for whether it is a non-defective product or a defective product. Therefore, only shield structure 20 found to be non-defective can be selected and used to assemble the module. In this way, a defect rate, and hence a loss in cost attributed to a defective product can be suppressed. In particular, when an expensive component such as an IC is mounted on first main surface 1a of wiring board 1 to assemble a module, a degree of wasting the expensive component can be reduced, which is beneficial.

Figure 8:
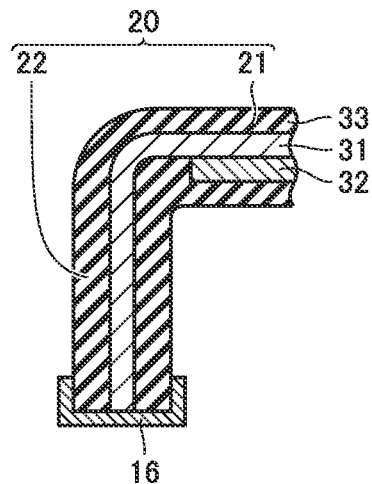
FIG. 8 is a diagram for illustrating an exemplary variation of a method for connecting the conductor incorporated structure and a wiring board comprised in the module according to the first embodiment of the present invention.

While in the example shown in FIGS. 3 and 4 shield structure 20 has sidewall portion 22 with a lower end bent so that electrical connection is made to first main surface 1a of wiring board 1 by a lower surface of shield structure 20, how shield structure 20 is connected to wiring board 1 is not limited thereto. For example, a connection method as shown in FIG. 8 may also be employed. In FIG. 8, an end face electrode 16 is provided so as to wrap around an end face of sidewall portion 22 of shield structure 20. Bringing an end portion provided with such an end face electrode 16 into contact with electrode 14 disposed on first main surface 1a can achieve electrical connection. Alternatively, end face electrode 16 and electrode 14 disposed on first main surface 1a may be electrically connected via solder 11.

Alternatively, rather than electrode 14, a through hole may be provided in first main surface 1a, and an end portion provided with end face electrode 16 may be inserted into the through hole to electrically connect end face electrode 16 to a conductor covering an internal surface of the through hole.

Conductive layer 31 is preferably made of a metal having low resistivity. Conductive layer 31 is preferably made of any metal selected from Cu, Ag, Au, Al, and the like, for example.

Magnetic layer 32 may be made of any of a magnetic metal such as Ni, a magnetic alloy such as FeNi, and a sintered material of ferrite or the like. Alternatively, magnetic layer 32 may be a mixture of a filler of a magnetic material and resin.

As a material for insulating layer 33, a flexible insulating material such as polyimide or a liquid crystal polymer may be employed. Polyimide is easily bent, and is thus suitable as a material for insulating layer 33.

Thus, by adopting a flexible material as the insulator, it becomes easy to bend and dispose the shield structure along a desired path.

Figure 9:
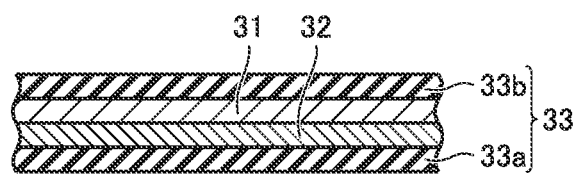
FIG. 9 is a partial cross-sectional view of a first example of a top side portion of the conductor incorporated structure comprised in the module according to the first embodiment of the present invention.

A part of top side portion 21 of shield structure 20 is enlarged for describing an order of disposing each layer constituting shield structure 20. Shield structure 20 may be formed of layers stacked in a pattern as shown in FIG. 9. In the example shown in FIG. 9, conductive layer 31 is disposed on an upper side of magnetic layer 32 in contact therewith, and these two layers are sandwiched by insulating layers 33a and 33b. Insulating layer 33 includes insulating layers 33a and 33b.

Figure 10:
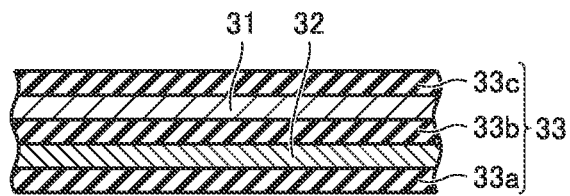
FIG. 10 is a partial cross-sectional view of a second example of the top side portion of the conductor incorporated structure comprised in the module according to the first embodiment of the present invention.

Shield structure 20 may be formed of layers stacked in a pattern as shown in FIG. 10. In the example shown in FIG. 10, insulating layer 33b is disposed on an upper side of magnetic layer 32, and conductive layer 31 is disposed on an upper side of insulating layer 33b. These three layers are sandwiched by insulating layers 33a and 33c. Insulating layer 33 includes insulating layers 33a, 33b and 33c.

Figure 11:
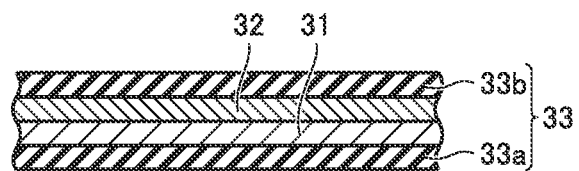
FIG. 11 is a partial cross-sectional view of a third example of the top side portion of the conductor incorporated structure comprised in the module according to the first embodiment of the present invention.

Shield structure 20 may be formed of layers stacked in a pattern as shown in FIG. 11. In the example shown in FIG. 11, magnetic layer 32 is disposed on an upper side of conductive layer 31 in contact therewith, and these two layers are sandwiched by insulating layers 33a and 33b. Insulating layer 33 includes insulating layers 33a and 33b.

Figure 12:
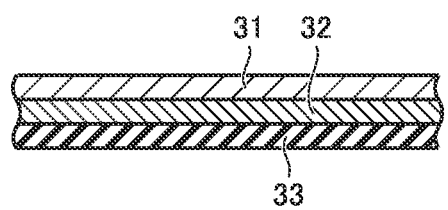
FIG. 12 is a partial cross-sectional view of a fourth example of the top side portion of the conductor incorporated structure comprised in the module according to the first embodiment of the present invention.

Shield structure 20 may be formed of layers stacked in a pattern as shown in FIG. 12. In the example shown in FIG. 11, conductive layer 31 is disposed on an upper side of magnetic layer 32 in contact therewith, and conductive layer 31 has an exposed upper surface. Magnetic layer 32 has a lower surface covered with insulating layer 33. When magnetic layer 32 physically comes into contact with a mounted component, magnetic layer 32 may crack, and accordingly, in order to protect magnetic layer 32, magnetic layer 32 preferably has a lower surface covered with insulating layer 33, as shown in FIG. 12. As conductive layer 31 has an upper surface covered with first sealing resin 6a, it may not necessarily be covered with an insulating layer, and a structure with conductive layer 31 having an exposed upper surface, as shown in FIG. 12, may also be employed.

Figure 13:
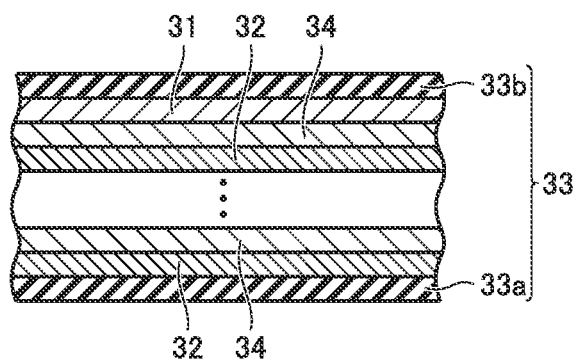
FIG. 13 is a partial cross-sectional view of a fifth example of the top side portion of the conductor incorporated structure comprised in the module according to the first embodiment of the present invention.

Shield structure 20 may be formed of layers stacked in a pattern as shown in FIG. 13. The example shown in FIG. 13 corresponds to the example shown in FIG. 9 with magnetic layer 32 that is a single layer replaced with one or more stacked pairs of magnetic layer 32 and a nonmagnetic conductive layer 34 disposed one on the other. Magnetic layer 32 and nonmagnetic conductive layer 34 are alternately disposed one on the other. Nonmagnetic conductive layer 34 is preferably formed of a metal which is non-magnetic and has a low resistivity. Nonmagnetic conductive layer 34 may for example be made of Cu.

First component 3a is preferably a component that should avoid interference by an external low frequency. By adopting this configuration, an effect of the present invention can be remarkably enjoyed. A "component that should avoid interference by an external low frequency" may for example be an active device such as an IC or a clock device such as an oscillator. Magnetic layer 32 covers an area, which is not limited to a periphery of first component 3a, and magnetic layer 32 may cover a signal line extending from first component 3a and a plurality of components such as a component connected by the signal line. A component connected by a signal line extending from first component 3a may have its entire surface covered or may have only a portion covered. A "portion" as referred to herein is a circuit block involved in processing a signal issued from first component 3a for example for an IC.

First component 3a is preferably an IC. An IC is expensive, and by adopting this configuration, only shield structure 20 which can be confirmed to be a non-defective product can be attached thereto, and wasting the IC can be avoided.

Preferably, second component 3b and third component 3c are in such a relation that at least one thereof should be prevented from electromagnetically interfering with the other thereof. By adopting this configuration, internal interference wave 92 is shielded by the sidewall portion's conductive layer 31v, which can prevent the one from electromagnetically interfering with the other. A component "in such a relation that at least one should be prevented from electromagnetically interfering with the other" is an active device such as an IC.

While the present embodiment has been described based on an example in which first component 3a, second component 3b, and third component 3c are mounted on first main surface 1a of wiring board 1, the number of components is not necessarily three. The number of components may be two. When two components are considered, the following can be grasped:

In FIG. 2, a component denoted by reference numeral 3b is regarded as a "first component," and a component denoted by reference numeral 3c is regarded as a "second component." A portion electrically connected to first main surface 1a between the first component (component 3b) and the second component (component 3c) is regarded as a "sidewall portion." The top side portion is the same as top side portion 21 shown in FIG. 2. In this case, magnetic layer 32 in top side portion 21 is located over the first component (component 3b), and conductive layer 31 is electrically connected in sidewall portion 22 to ground conductor 10 between the first component (component 3b) and the second component (component 3c), as shown in FIG. 4. Electrode 14 is electrically connected to ground conductor 10 via a wiring (not shown).

When this is re-arranged and re-written, it can be expressed as follows: The module comprises wiring board 1 having first main surface 1a and including ground conductor 10, a first component (component 3b) and a second component (component 3b) mounted on first main surface 1a, shield structure 20 mounted on first main surface 1a, first sealing resin 6a that seals the first component (component 3b), the second component (component 3b) and shield structure 20, and shield film 8 that covers an upper surface and side surface of first sealing resin 6a and a side surface of wiring board 1, shield film 8 being electrically connected to ground conductor 10, shield structure 20 including conductive layer 31 and magnetic layer 32, shield structure 20 further including top side portion 21 and at least one sidewall portion 22 bent from top side portion 21 and thus extending therefrom, magnetic layer 32 in top side portion 21 being located over the first component, conductive layer 31 in sidewall portion 22 being electrically connected to ground conductor 10 between the first component and the second component. In this module, as shown in FIG. 4, shield structure 20 is disposed such that sidewall portion 22 is located between the first component (component 3b) and the second component (component 3c), and internal interference wave 92 traveling from the first component toward the second component is shielded by the sidewall portion's conductive layer 31v. This can prevent internal interference wave 92 from affecting the second component.

Second Embodiment

Figure 14:
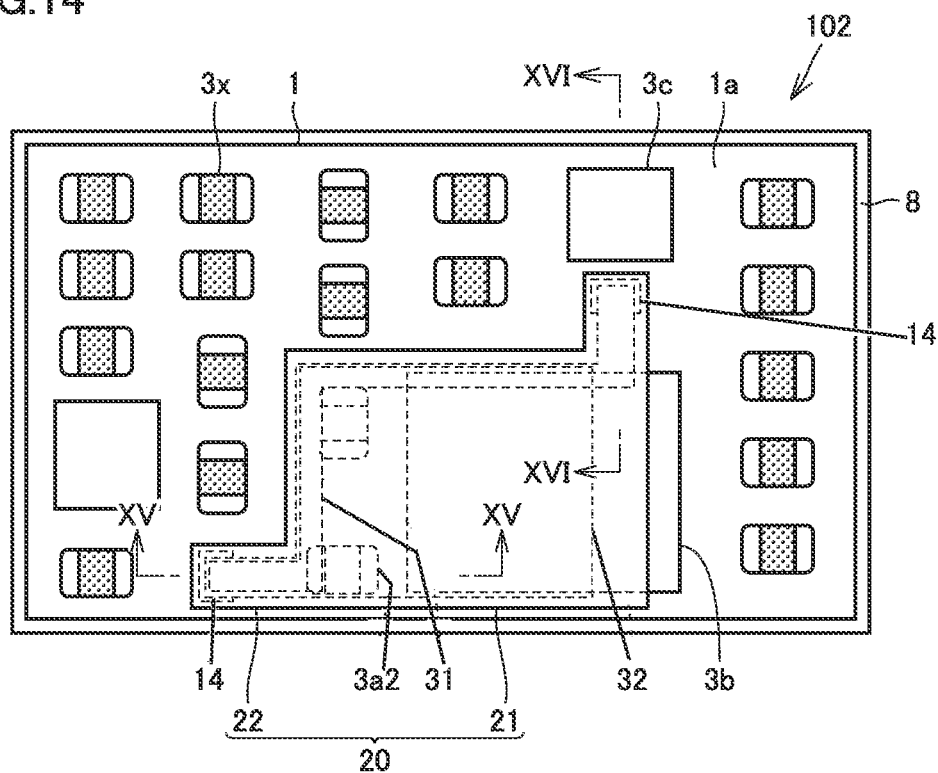
FIG. 14 is a transparent plan view of a module according to a second embodiment of the present invention.
Figure 15:
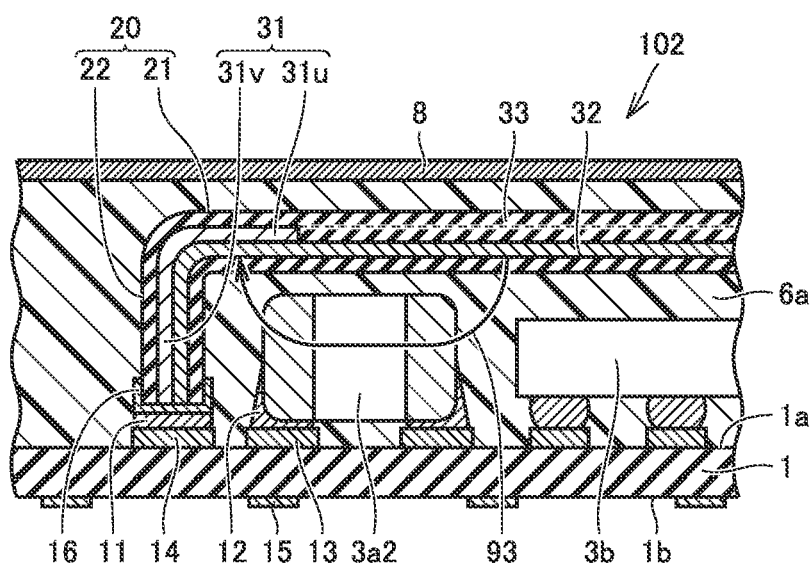
FIG. 15 is a cross-sectional view taken along a line XV-XV indicated in FIG. 14.
Figure 16:
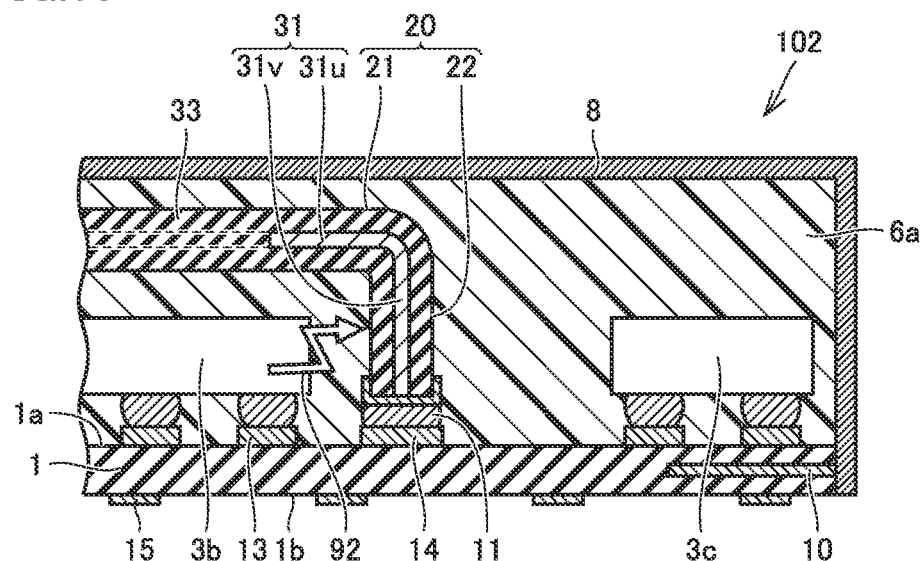
FIG. 16 is a cross-sectional view taken along a line XVI-XVI indicated in FIG. 14.

A module according to a second embodiment of the present invention will now be described with reference to FIGS. 14 to 16. FIG. 14 is a transparent view of a module 102 according to the present embodiment showing an interior thereof as viewed exactly from above. FIG. 15 is a cross-sectional view taken along a line XV-XV indicated in FIG. 14. FIG. 16 is a cross-sectional view taken along a line XVI-XVI indicated in FIG. 14.

In module 102, a first component 3a2 is mounted on first main surface 1a instead of first component 3a. First component 3a2 is an inductor. First component 3a2 has electrodes at opposite ends. First component 3a2 has the opposite electrodes each mounted on electrode 13 via solder 12. Shield structure 20 includes magnetic layer 32 extending to an end of sidewall portion 22. In the present embodiment, magnetic layer 32 is of a non-conductive material. Magnetic layer 32 may for example be a mixture of a filler of a magnetic material and resin. End face electrode 16 is provided at a lower end of sidewall portion 22. End face electrode 16 and electrode 14 are electrically connected via solder 11. Thus, conductive layer 31 is electrically connected to electrode 14. Electrode 14 is grounded via a wiring (not shown).

The configuration of module 102 in the present embodiment is re-arranged and represented as follows: In the present embodiment, first component 3a2 is an inductor, magnetic layer 32 is non-conductive, and magnetic layer 32 is disposed between the top side portion's conductive layer 31u and first component 3a2.

In the present embodiment, first component 3a2 is an inductor, and a magnetic field 93 is generated when first component 3a2 operates. Magnetic field 93 is shielded by magnetic layer 32 included in shield structure 20.

In the present embodiment as well, shield structure 20 can be formed in advance as a component separately from wiring board 1, and, as well as in the first embodiment, a module capable of suppressing a defect rate and suppressing a loss in cost attributed to a defective product can be provided.

While a purpose of mounting shield structure 20 in the first embodiment is to shield an external low frequency, the purpose may be to shield a magnetic field of an incorporated inductor to prevent it from leaking outside, as has been indicated in the present embodiment.

An effect of a magnetic layer to block a magnetic field will now be described in more detail. When a magnetic field generated by first component 3a2 that is an inductor component is incident on conductive layer 31, an eddy current is generated in conductive layer 31. The eddy current flows in a direction opposite to a change of the magnetic field. The magnetic field by the eddy current will weaken the magnetic field of the inductor, and the inductor has a degraded Q value. Magnetic layer 32 can block a magnetic field, and disposing magnetic layer 32 between conductive layer 31 and first component 3a2 can prevent an eddy current from being generated. This can prevent the inductor from having a degraded Q-value. When magnetic layer 32 is conductive, and a magnetic field is incident on magnetic layer 32, an eddy current is similarly generated when the magnetic field is incident on a conductive layer, and as a result, the inductor's Q value is degraded. Accordingly, magnetic layer 32 is preferably non-conductive.

Third Embodiment

Figure 17:
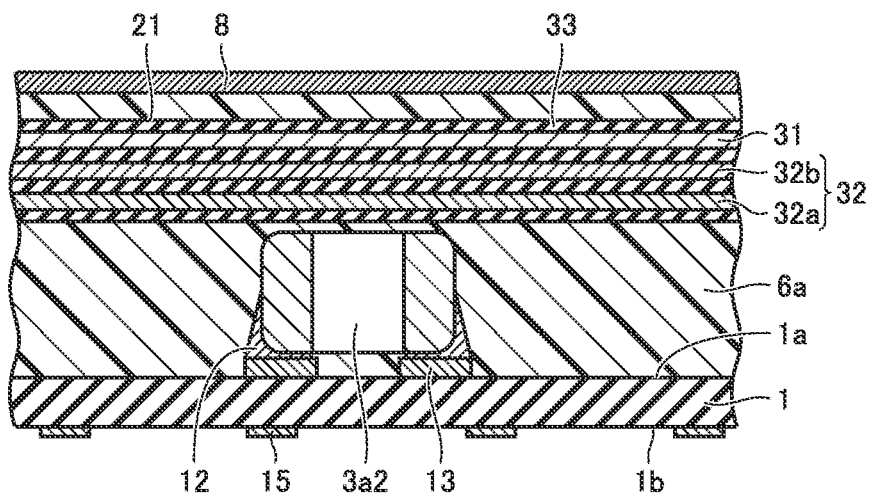
FIG. 17 is a partially enlarged cross-sectional view showing a vicinity of a first component of a module according to a third embodiment of the present invention.
Figure 18:
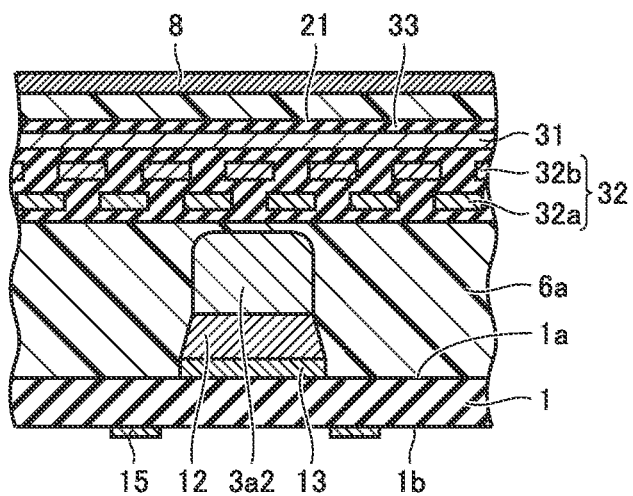
FIG. 18 is a partially enlarged cross-sectional view in a direction different than FIG. 17 by 90°.
Figure 19:
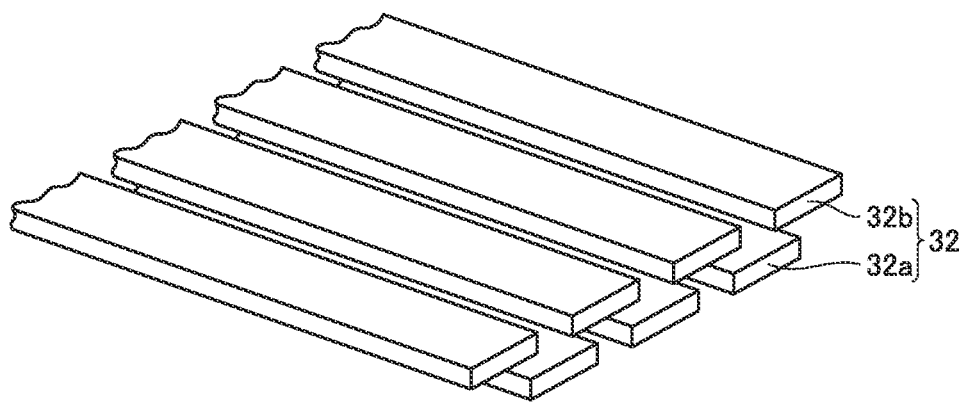
FIG. 19 is a perspective view showing a state in which a magnetic layer included in a conductor incorporated structure comprised in the module according to the third embodiment of the present invention is extracted alone.

A module according to a third embodiment of the present invention will now be described with reference to FIGS. 17 to 19. FIG. 17 is an enlarged cross-sectional view of a vicinity of first component 3a2 of the module. FIG. 18 is a cross-sectional view in a direction different than FIG. 17 by 90°.

In the module of the present embodiment, first component 3a2 is mounted on first main surface 1a. First component 3a2 is an inductor. First component 3a2 is sealed by first sealing resin 6a. Shield structure 20 is disposed such that shield structure 20 has top side portion 21 over first component 3a2. Top side portion 21 includes conductive layer 31 and magnetic layer 32 therein.

In the module according to the present embodiment, magnetic layer 32 includes a first magnetic layer 32a and a second magnetic layer 32b. Insulating layer 33 is disposed between first magnetic layer 32a and second magnetic layer 32b. Insulating layer 33 also covers a lower side of first magnetic layer 32a and an upper side of second magnetic layer 32b, and furthermore, also covers an upper side of conductive layer 31. First magnetic layer 32a and second magnetic layer 32b each have a pattern of a plurality of stripes. First magnetic layer 32a and second magnetic layer 32b are disposed in such a positional relationship that they partially overlap such that when viewed in a direction perpendicular to magnetic layer 32, a side behind the magnetic layer is invisible. FIG. 19 is a perspective view of magnetic layer 32 extracted alone.

The remainder in configuration is similar to that described in the first embodiment. In the present embodiment, magnetic layer 32 includes first magnetic layer 32a and second magnetic layer 32b disposed in such a positional relationship that they partially overlap such that when viewed in a direction perpendicular to magnetic layer 32, a side behind the magnetic layer is invisible, and a magnetic field thus cannot pass through magnetic layer 32. Further, as first magnetic layer 32a and second magnetic layer 32b each have a pattern of a plurality of stripes, there is no loop path passing an eddy current, and thus no eddy current flows. Even if first magnetic layer 32a and second magnetic layer 32b are formed of an electrically conductive magnetic material, no eddy current flows. The axial direction of the inductor and the longitudinal direction of the pattern of the plurality of stripes may be parallel or perpendicular or may intersect each other obliquely. The stripe pattern may be curved or bent. When each and every single linear pattern included in the stripe pattern is noted, a spacing between adjacent linear patterns may vary depending on the location insofar as the adjacent linear patterns do not intersect each other. There may be a location at which a linear pattern is not parallel to an adjacent linear pattern. A width by which first magnetic layer 32a and second magnetic layer 32b overlap may vary depending on the location. In order to prevent a magnetic field from easily leaking, in addition to first magnetic layer 32a and second magnetic layer 32b, another magnetic layer having a stripe pattern may be disposed to overlap first magnetic layer 32a and second magnetic layer 32b.

Fourth Embodiment

Figure 20:
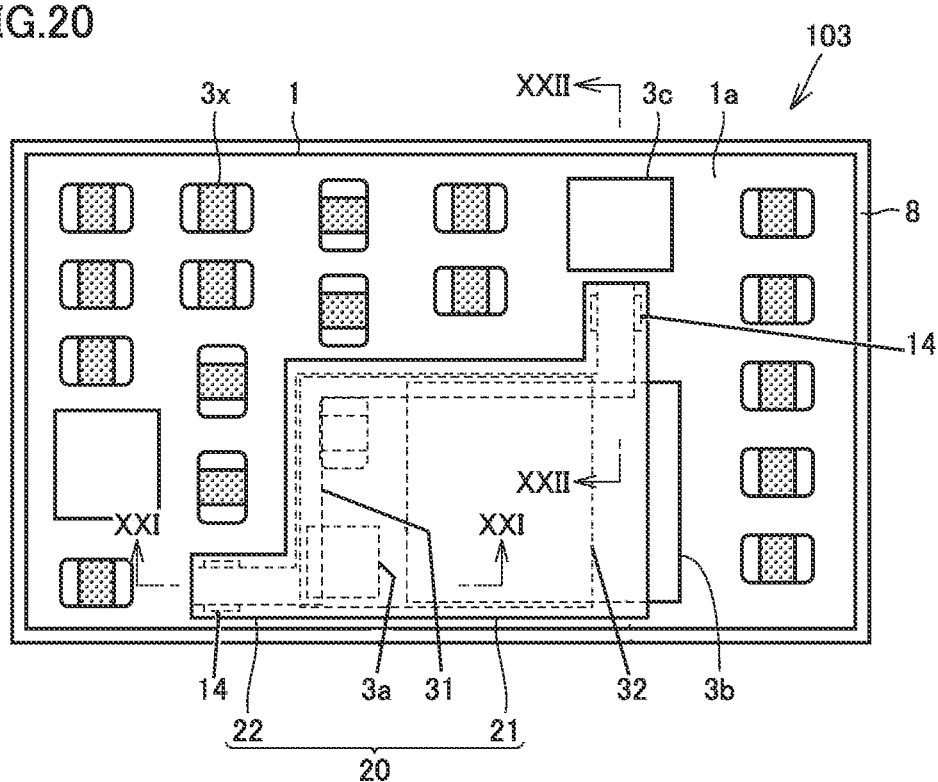
FIG. 20 is a transparent plan view of a module according to a fourth embodiment of the present invention.
Figure 21:
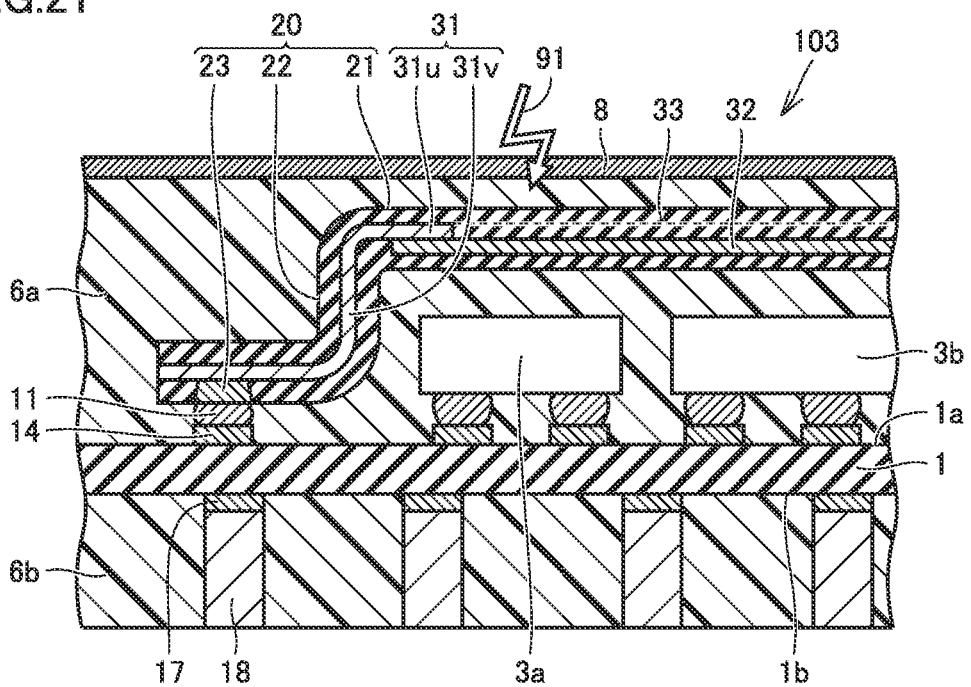
FIG. 21 is a cross-sectional view taken along a line XXI-XXI indicated in FIG. 20.
Figure 22:
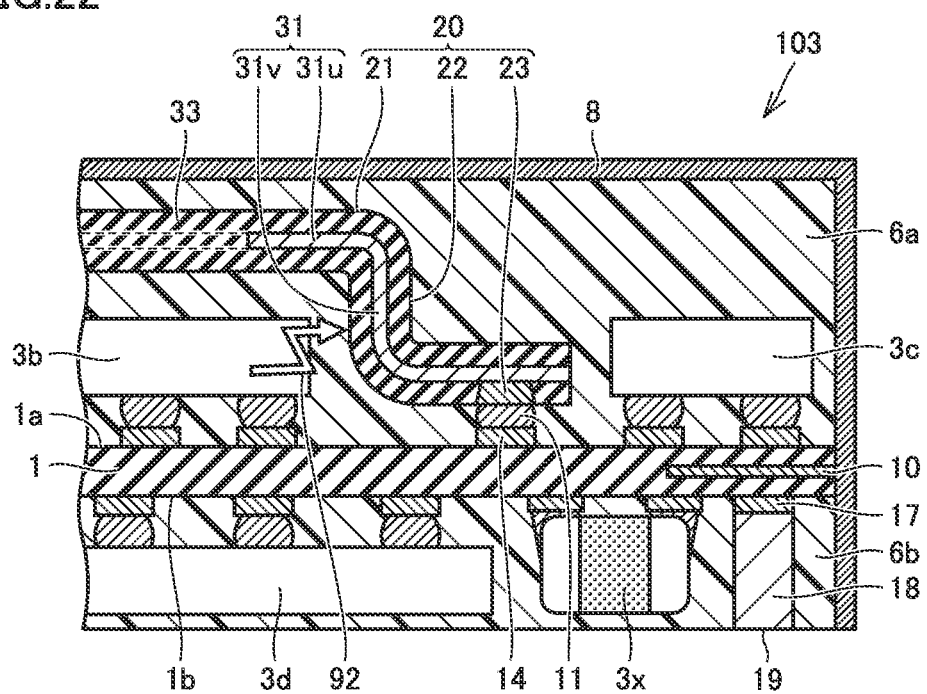
FIG. 22 is a cross-sectional view taken along a line XXII-XXII indicated in FIG. 20.

A module according to a fourth embodiment of the present invention will now be described with reference to FIGS. 20 to 22. FIG. 20 is a transparent view of a module 103 according to the present embodiment showing an interior thereof as viewed exactly from above. FIG. 21 is a cross-sectional view taken along a line XXI-XXI indicated in FIG. 20. FIG. 22 is a cross-sectional view taken along a line XXII-XXII indicated in FIG. 20.

Although module 103 also has a basic configuration which is common as compared with module 101 described in the first embodiment, the following can further be said.

In module 103, wiring board 1 has a second main surface 1b on a side opposite to first main surface 1a. Module 103 comprises a fourth component 3d mounted on second main surface 1b, a second sealing resin 6b that seals fourth component 3d, and a connection terminal 18 erected on second main surface 1b and penetrating second sealing resin 6b. Connection terminal 18 has an end face 19 exposed from second sealing resin 6b. Connection terminal 18 may be a metal column. Shield film 8 covers a side surface of second sealing resin 6b.

The present embodiment can be as effective as the first embodiment. Note that a plurality of the above embodiments may be combined as appropriate and employed.

It should be understood that the embodiments disclosed herein are illustrative and non-restrictive in any respect. The scope of the present invention is defined by the terms of the claims, and is intended to include any modifications within the meaning and scope equivalent to the terms of the claims.

REFERENCE SIGNS LIST 1 wiring board, 1a first main surface, 1b second main surface, 3a, 3a2 first component, 3b second component, 3c third component, 3d, 3x component, 8 shield film, 10 ground conductor, 11, 12 solder, 13 electrode (for mounting a component), 14 electrode (electrically connected to the ground conductor), 15 external terminal, 16 end face electrode, 17 electrode (provided on the second main surface), 18 connection terminal, 19 end face (of the connection terminal), 20 shield structure, 21 top side portion, 22 sidewall portion, 23 connection electrode, 31 conductive layer, 31u top side portion's conductive layer, 31v sidewall portion's conductive layer, 32 magnetic layer, 32a first magnetic layer, 32b second magnetic layer, 33 insulating layer, 34 nonmagnetic conductive layer, 91 low-frequency interference wave, 92 internal interference wave, 93 magnetic field, 101, 102, 103 module.

The invention claimed is:
1. A module comprising:
a wiring board having a first main surface and comprising a ground conductor;
a first circuit component and a second circuit component mounted on the first main surface;
a shield structure mounted on the first main surface;
a first sealing resin that seals the first component, the second component, and the shield structure; and
a shield film that covers an upper surface and a side surface of the first sealing resin, and that covers a side surface of the wiring board, wherein:
the shield film is electrically connected to the ground conductor,
the shield structure comprises a conductive layer and a magnetic layer,
the shield structure has a top side portion and at least one sidewall portion that is bent from the top side portion and that extends from the top side portion,
the magnetic layer is at the top side portion and is over the first circuit component, and the conductive layer is at the sidewall portion and is electrically connected to the ground conductor between the first circuit component and the second circuit component.

2. A module comprising:
a wiring board having a first main surface and comprising a ground conductor;
a first circuit component, a second circuit component, and a third circuit component mounted on the first main surface;
a shield structure mounted on the first main surface;
a first sealing resin that seals the first circuit component, the second circuit component, the third circuit component, and the shield structure; and
a shield film that covers an upper surface and a side surface of the first sealing resin, and that covers a side surface of the wiring board, wherein:
the shield film is electrically connected to the ground conductor,
the shield structure has a top side portion and at least one sidewall portion that is bent from the top side portion and that extends from the top side portion,
the top side portion comprises a top conductive layer and a magnetic layer therein,
the sidewall portion comprises a sidewall conductive layer therein,
the top conductive layer and the sidewall conductive layer are electrically connected to the ground conductor,
the magnetic layer is over the first circuit component, and
the sidewall conductive layer is between the second circuit component and the third circuit component.

3. The module according to claim 1, wherein the conductive layer and the magnetic layer are embedded in an insulator.

4. The module according to claim 2, wherein the top conductive layer and the magnetic layer are embedded in an insulator.

5. The module according to claim 3, wherein the insulator is a flexible material.

6. The module according to claim 4, wherein the insulator is a flexible material.

7. The module according to claim 1, wherein the first circuit component is an integrated circuit or an oscillator.

8. The module according to claim 1, wherein the first circuit component is an integrated circuit or an oscillator.

9. The module according to claim 1, wherein the shield structure is configured to prevent electromagnetic interference between the first circuit component and the second circuit component.

10. The module according to claim 2, wherein the shield structure is configured to prevent electromagnetic interference between the second circuit component and the third circuit component.

11. The module according to claim 1, wherein the first circuit component is an inductor, the magnetic layer is non-conductive, and the magnetic layer is between the conductive layer and the first circuit component.

12. The module according to claim 2, wherein the first circuit component is an inductor, the magnetic layer is non-conductive, and the magnetic layer is between the top conductive layer and the first circuit component.

13. The module according to claim 11, wherein:
the magnetic layer comprises a first magnetic layer, a second magnetic layer, and an insulating layer between the first magnetic layer and the second magnetic layer,
the first magnetic layer and the second magnetic layer are each of a pattern of a plurality of stripes, and
the first magnetic layer and the second magnetic layer partially overlap such that when viewed in a direction perpendicular to the magnetic layer, a side behind the magnetic layer is not visible.

14. The module according to claim 12, wherein:
the top magnetic layer comprises a first magnetic layer, a second magnetic layer, and an insulating layer between the first magnetic layer and the second magnetic layer,
the first magnetic layer and the second magnetic layer are each of a pattern of a plurality of stripes, and
the first magnetic layer and the second magnetic layer partially overlap such that when viewed in a direction perpendicular to the top magnetic layer, a side behind the magnetic layer is not visible.

15. The module according to claim 1, wherein:
the wiring board has a second main surface on a side opposite to the first main surface,
the module further comprises a fourth circuit component mounted on the second main surface, a second sealing resin that seals the fourth circuit component, and a connection terminal erected on the second main surface and penetrating the second sealing resin, and
the shield film covers a side surface of the second sealing resin.

16. The module according to claim 2, wherein:
the wiring board has a second main surface on a side opposite to the first main surface,
the module further comprises a fourth circuit component mounted on the second main surface, a second sealing resin that seals the fourth circuit component, and a connection terminal erected on the second main surface and penetrating the second sealing resin, and
the shield film covers a side surface of the second sealing resin.

* * * * *